United States Patent
Hayashi et al.

(10) Patent No.: US 6,746,816 B2
(45) Date of Patent: Jun. 8, 2004

(54) PHOTOSENSITIVE RESIN COMPOSITION AND CIRCUIT BOARD

(75) Inventors: Shunichi Hayashi, Osaka (JP); Hirofumi Fujii, Osaka (JP)

(73) Assignee: Nitto Denko Corporation, Osaka (JP)

(*) Notice: Subject to any disclaimer, the term of this patent is extended or adjusted under 35 U.S.C. 154(b) by 137 days.

(21) Appl. No.: 09/983,943

(22) Filed: Oct. 26, 2001

(65) Prior Publication Data
US 2002/0055062 A1 May 9, 2002

(30) Foreign Application Priority Data
Nov. 8, 2000 (JP) .................... P. 2000-340235

(51) Int. Cl.$^7$ ............... G03C 1/73; G03F 7/038
(52) U.S. Cl. ............ 430/270.1; 430/281.1; 430/325; 430/905; 430/311; 430/319
(58) Field of Search ............ 430/270.1, 281.1, 430/905, 311, 319, 325

(56) References Cited

U.S. PATENT DOCUMENTS

| | | | | |
|---|---|---|---|---|
| 3,891,441 A | * | 6/1975 | Tsuji et al. | 430/273.1 |
| 4,841,017 A | * | 6/1989 | Murai et al. | 525/327.3 |
| 5,733,823 A | * | 3/1998 | Sugioka et al. | 442/110 |
| 6,132,930 A | | 10/2000 | Hayashi et al. | 430/270.1 |
| 6,348,540 B1 | * | 2/2002 | Sugioka et al. | 524/577 |

FOREIGN PATENT DOCUMENTS

| | | | |
|---|---|---|---|
| EP | 0 459 395 A2 | * | 12/1991 |
| EP | 0 578 177 A2 | | 1/1994 |
| EP | 0 675 409 A1 | | 10/1995 |
| EP | 0 917 001 A1 | | 5/1999 |
| JP | 6-75376 | | 3/1994 ........... G03F/7/038 |
| JP | 7-271034 | | 10/1995 ........... G03F/7/038 |
| JP | 10-39510 | | 2/1998 ........... G03F/7/038 |
| JP | 2000-267276 | * | 9/2000 |

OTHER PUBLICATIONS

Machine–assisted English translation for JP 2000–267276 Provided by Japan Patent office, Sep. 2000.*
European Search Report dated Jul. 3, 2003.

* cited by examiner

*Primary Examiner*—Mark I. Huff
*Assistant Examiner*—Sin J. Lee
(74) *Attorney, Agent, or Firm*—Sughrue Mion, PLLC

(57) ABSTRACT

A photosensitive resin composition which is excellent in both sensitivity and resolution, can be rapidly developed with an aqueous alkali solution alone, further has excellent adhesion to substrates, and can give through imidization a light-colored polyimide resin film; and a circuit board having an insulating layer obtained from the photosensitive resin composition. The photosensitive resin composition comprises a poly(amic acid) resin, a 1,4-dihydropyridine derivative and a polyethylene glycol, and may optionally further contain a polyhydric phenol compound. This photosensitive resin composition can be developed at a high rate with a developing solution consisting only of an aqueous alkali solution. As a result, a satisfactory negative-pattern film which is a light-colored film can be formed with high sensitivity, high resolution, and a reduced film loss while preventing film coloration.

14 Claims, 3 Drawing Sheets

PHOTOSENSITIVE RESIN COMPOSITION AND CIRCUIT BOARD

FIELD OF THE INVENTION

The present invention relates to a photosensitive resin composition and a circuit board. More particularly, the invention relates to a photosensitive resin composition suitable for use in forming an insulating layer for circuit boards, and a circuit board having an insulating layer obtained from the photosensitive resin composition.

DESCRIPTION OF THE RELATED ART

Photosensitive poly(amic acid) resins containing a 1,4-dihydropyridine derivative as a photosensitizer are described in, e.g., JP-A-6-75376 (the term "JP-A" as used herein means an "unexamined published Japanese patent application"), JP-A-7-271034, and JP-A-10-39510. Such a photosensitive poly(amic acid) resin is applied to a substrate and the resultant coating film is irradiated with actinic rays through a given photomask, subjected to exposure and development, and then imidized by heating, whereby a polyimide resin film of a given pattern can be formed.

Such photosensitive poly(amic acid) resins containing a 1,4-dihydropyridine derivative as a photosensitizer are excellent in sensitivity and resolution and the films of a given pattern obtained therefrom have high heat resistance. Because of this, these resins are used for forming insulating layers such as an interlayer dielectric and a surface protective layer (insulating protective layer) in circuit boards.

However, the photosensitive poly(amic acid) resins described in JP-A-6-75376 and JP-A-7-271034 have the following drawback. Since the 1,4-dihydropyridine derivative contained therein is insoluble in aqueous alkali solutions, development with an aqueous alkali solution alone results not only in a low rate of development but in precipitation of crystals of the 1,4-dihydropyridine derivative on the substrate or in the developing agent. If crystals of the 1,4-dihydropyridine derivative precipitate on the substrate, there is the possibility that precise pattern-wise development might be inhibited or recessed areas of the fine pattern formed through development might be partly filled up, resulting in reduced resolution. For developing such a photosensitive poly(amic acid) resin, it is therefore necessary to use as a developing solution a mixture of an aqueous alkali solution and a water-soluble organic solvent such as an alcohol.

On the other hand, the photosensitive poly(amic acid) resin described in JP-A-10-39510 contains a 1,4-hydropyridine derivative having enhanced solubility in aqueous alkali solutions and, hence, can be developed with an aqueous alkali solution alone. However, the rate of development thereof is still not fully satisfactory, and there is a desire for a photosensitive poly(amic acid) resin attaining a higher rate of development.

Furthermore, those photosensitive poly(amic acid) resins containing a 1,4-dihydropyridine derivative as a photosensitizer finally give a dark-colored (black-brown) film through imidization conducted at 300° C. or higher. The conventional resins hence have a drawback that in the case where the film is used, e.g., as the surface protective layer of a circuit board, it is difficult to recognize the conductor circuit underlying the surface protective layer due to the dark color of the layer, making it difficult to inspect the appearance of the conductor circuit.

SUMMARY OF THE INVENTION

The invention has been achieved in view of these circumstances.

Accordingly, one object of the invention is to provide a photosensitive resin composition which is excellent in both sensitivity and resolution, can be rapidly developed with an aqueous alkali solution alone, further has excellent adhesion to substrates, and can give through imidization a light-colored polyimide resin film.

Another object of the invention is to provide a circuit board having an insulating layer obtained from the photosensitive resin composition.

In order to accomplish those objects, the invention provides a photosensitive resin composition which comprises a poly(amic acid) resin, a 1,4-dihydropyridine derivative represented by the following formula (1), and a polyethylene glycol:

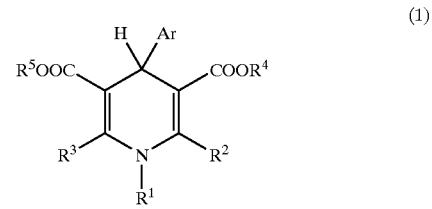

wherein Ar represents an aromatic group having a nitro group at an ortho position; $R^1$ represents a hydrogen atom or an alkyl group having 1 to 5 carbon atoms; and $R^2$, $R^3$, $R^4$, and $R^5$ each represent a hydrogen atom or an alkyl group having 1 to 4 carbon atoms.

The photosensitive resin composition may further comprise a polyhydric phenol compound.

The invention further provides a circuit board having an insulating layer obtained from either of the above photosensitive resin compositions, and a circuit board having a surface protective layer obtained from either of the above photosensitive resin compositions.

BRIEF DESCRIPTION OF THE DRAWINGS

FIG. 1 is a view showing steps of one embodiment of a method for forming an insulating layer in a circuit board from a photosensitive resin composition of the invention, wherein:

FIG. 1(a) shows a step in which a substrate is prepared;

FIG. 1(b) shows a step in which a film of the photosensitive resin composition is formed on the substrate;

FIG. 1(c) shows a step in which the film is exposed through a photomask;

FIG. 1(d) shows a step in which the film is developed; and

FIG. 1(e) shows a step in which the film is cured to form an insulating layer.

FIG. 2 is a view showing steps of one embodiment of a method for forming a circuit board by conducting a procedure subsequently to the steps shown in FIG. 1, wherein:

FIG. 2(a) shows a step in which a conductor layer having a given circuit pattern is formed on the insulating layer; and FIG. 2(b) shows a step in which a surface protective layer is formed on the conductor layer.

FIG. 3 is a view showing another embodiment of a method for forming a circuit board using a photosensitive resin composition of the invention, wherein FIG. 3(a) shows a step in which a two-layer substrate is prepared;

FIG. 3(b) shows a step in which the conductor layer of the two-layer substrate is formed into a given circuit pattern; and FIG. 3(c) shows a step in which a surface protective layer having an opening is formed on the conductor layer.

DESCRIPTION OF REFERENCE NUMERALS

Figure 1:
Figure 1:
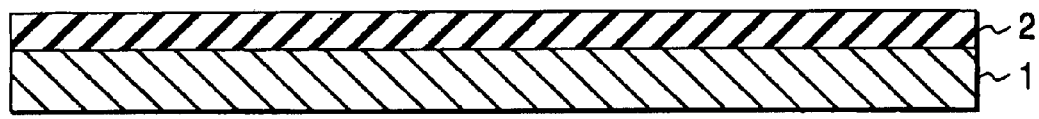
Figure 1:
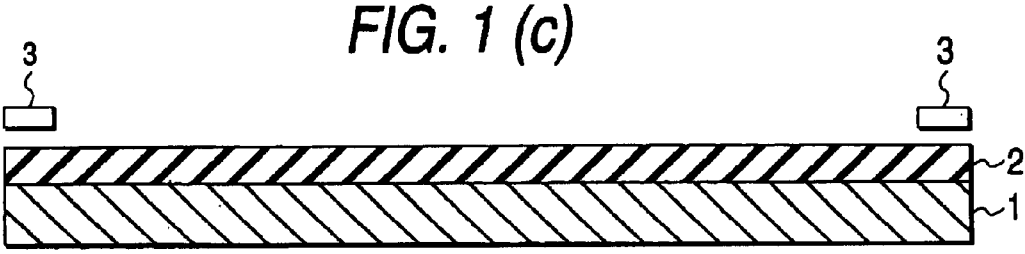
Figure 1:
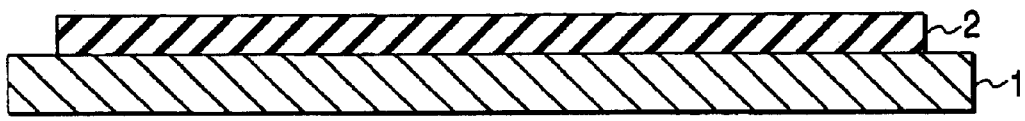
Figure 1:
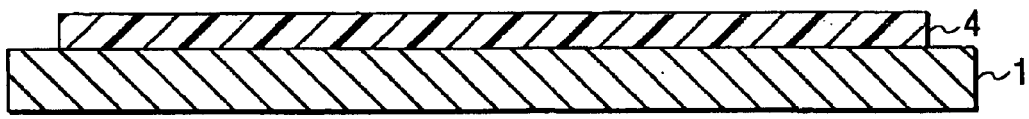

1 Substrate
2 Photosensitive resin composition
3 Photomask
4 Base layer
6 Surface protective layer

DESCRIPTION OF THE PREFERRED EMBODIMENTS

The photosensitive resin composition of the invention comprises a poly(amic acid) resin, a 1,4-dihydropyridine derivative represented by the following formula (1), and a polyethylene glycol:

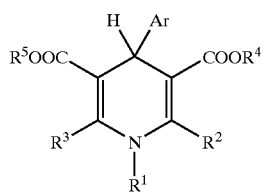

(1)

wherein Ar represents an aromatic group having a nitro group at an ortho position; $R^1$ represents a hydrogen atom or an alkyl group having 1 to 5 carbon atoms; and $R^2$, $R^3$, $R^4$, and $R^5$ each represent a hydrogen atom or an alkyl group having 1 to 4 carbon atoms.

The poly(amic acid) resin used in the invention is a precursor of a polyimide resin and is not particularly limited. However, this resin usually has repeating units represented by the following formula (2) and has a weight average molecular weight of, for example, about 5,000 to 200,000, preferably about 10,000 to 100,000:

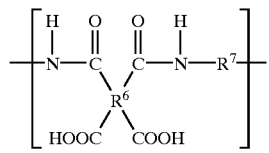

(2)

wherein $R^6$ represents a tetravalent organic group and $R^7$ represents a divalent organic group.

Examples of the tetravalent organic group represented by $R^6$ in formula (2) include tetravalent aromatic, aromatic-aliphatic, aliphatic and alicyclic organic groups, each having a skeleton such as benzene, naphthalene, perylene, diphenyl, diphenyl ether, diphenyl sulfone, diphenylpropane, diphenylhexafluoropropane, benzophenone, butane or cyclobutane. Preferred examples thereof include tetravalent organic groups having the skeleton of benzene, diphenyl, diphenylhexafluoropropane or benzophenone. The tetravalent organic groups represented by $R^6$ may be one kind or two or more kinds selected from those.

Examples of the divalent organic group represented by $R^7$ in formula (2) include divalent aromatic, aromatic-aliphatic, aliphatic and alicyclic organic groups having a skeleton such as diphenyl ether, benzophenone, diphenylmethane, diphenylpropane, diphenylhexafluoropropane, diphenyl sulfoxide, diphenyl sulfone, diphenyl, benzene or diphenoxybenzene. Preferred examples thereof include divalent organic groups having the skeleton of diphenyl ether, benzene or diphenoxybenzene. The divalent organic groups represented by $R^7$ may be one kind or two or more kinds selected from those.

Specifically, such a poly(amic acid) resin can be obtained by reacting an organic tetracarboxylic dianhydride with a diamine. Examples of the organic tetracarboxylic dianhydride include pyromellitic dianhydride, 3,3',4,4'-biphenyltetracarboxylic dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic dianhydride, bis(3,4-dicarboxyphenyl) ether dianhydride and bis(3,4-dicarboxyphenyl)sulfonic acid dianhydride. These dianhydrides may be used alone or in combination of two or more thereof.

Examples of the diamine include m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl)hexafluoropropane, 1,3-bis(4-aminophenoxy)benzene, 1,4-bis(4-aminophenoxy)benzene, 2,4-diaminotoluene, 2,6-diaminotoluene, diaminodiphenyl methane, 4,4'-diamino-2,2-dimethylbiphenyl and 2,2-bis(trifluoromethyl)-4,4'-diaminodiphenyl. These diamines may be used alone or in combination of two or more thereof.

In synthesizing a poly(amic acid) resin, the organic tetracarboxylic dianhydride may be reacted with the diamine in a substantially equimolar proportion in an appropriate organic solvent, e.g., a polar solvent such as N-methyl-2-pyrrolidone, N,N-dimethylacetamide, N,N-dimethylformamide, dimethyl sulfoxide or hexamethylphosphoramide, usually at a temperature of 0 to 90° C. for 1 to 48 hours. Thus, the objective poly(amic acid) resin can be obtained as a solution thereof.

The 1,4-dihydropyridine derivative used in the invention is represented by the following formula (1):

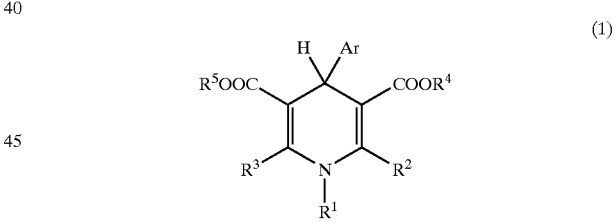

(1)

wherein Ar represents an aromatic group having a nitro group at an ortho position; $R^1$ represents a hydrogen atom or an alkyl group having 1 to 5 carbon atoms; and $R^2$, $R^3$, $R^4$, and $R^5$ each represent a hydrogen atom or an alkyl group having 1 to 4 carbon atoms.

Preferred example of the aromatic group having a nitro group at an ortho position which is represented by Ar in formula (1) includes o-nitrophenyl. Preferred examples of $R^1$, which represents a hydrogen atom or an alkyl group having 1 to 5 carbon atoms, include methyl, ethyl and propyl. Preferred examples of $R^2$, $R^3$, $R^4$, and $R^5$, which each represent a hydrogen atom or an alkyl group having 1 to 4 carbon atoms, include a hydrogen atom, methyl, and ethyl. In particular, $R^2$ and $R^3$ each preferably are a hydrogen atom.

Specific examples of the 1,4-dihydropyridine derivative include 1-ethyl-3,5-dimethoxycarbonyl-4-(2-nitrophenyl)-1,4-dihydropyridine, 1-methyl-3,5-dimethoxycarbonyl-4-

(2-nitrophenyl)-1,4-dihydropyridine, 1-propyl-3,5-dimethoxycarbonyl-4-(2-nitrophenyl)-1,4-dihydropyridine and 1-propyl-3,5-diethoxycarbonyl-4-(2-nitrophenyl)-1,4-dihydropyridine. Preferred of these 1,4-dihydropyridine derivatives is 1-ethyl-3,5-dimethoxycarbonyl-4-(2-nitrophenyl)-1,4-dihydropyridine, which is represented by the following formula (3).

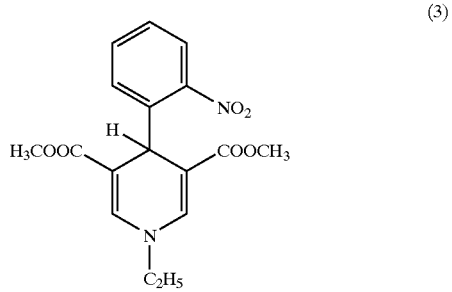

(3)

Such a 1,4-dihydropyridine derivative can be obtained by, for example, reacting a substituted benzaldehyde with an alkyl propiolate (an alkyl ester of propargylic acid) used in an amount two times by mole the amount of the aldehyde and with the corresponding primary amine in glacial acetic acid under reflux (see *Khim. Geterotsikl. Soed., pp.*1067–1071,1982).

The 1,4-dihydropyridine derivative is incorporated in an amount of generally 5 to 50 parts by weight, preferably 10 to 30 parts by weight, per 100 parts by weight of the poly(amic acid) resin. If the amount of the derivative incorporated is smaller than the lower limit, there are cases where when the resulting photosensitive resin composition is irradiated with actinic rays, the effect of reducing the solubility of the exposed areas in an alkaline developing agent is insufficient and the pattern thus formed is unclear. On the other hand, if the amount thereof is larger than the upper limit, there are cases where when the resulting photosensitive resin composition is stored as a solution, solid precipitation occurs and this exerts adverse influences on storage stability and suitability for pattern formation. In addition, there are cases where when the negative pattern formed from this composition is heat-treated, the film suffers a considerable weight loss, resulting in reduced mechanical strength.

The polyethylene glycol used in the invention serves to greatly increase the rate of development of the photosensitive resin composition of the invention with an aqueous alkali solution. The polyethylene glycol used has an average molecular weight (the term "average molecular weight" used herein means a "weight average molecular weight" unless otherwise indicated) of generally 200 to 2,000, preferably 400 to 1,000. The polyethylene glycol having such a low molecular weight has excellent solubility in the poly(amic acid) resin, so that it is present in an evenly dissolved state in the film formed by applying and drying a solution of the photosensitive resin composition. The polyethylene glycol can hence increase the rate of development with an aqueous alkali solution.

If the molecular weight of the polyethylene glycol exceeds 2,000, the solubility thereof in the poly(amic acid) resin decreases abruptly and there are cases where the polyethylene glycol separates out in a dry film of the photosensitive resin composition to cause sea-island phase separation and thereby make the film blush. In the film in such a state, the amount of the polyethylene glycol dissolved in the poly(amic acid) resin is small and, hence, there are cases where the polyethylene glycol is ineffective in increasing the rate of development with an aqueous alkali solution. On the other hand, if the molecular weight of the polyethylene glycol is lower than 200, there are cases where the polyethylene glycol partly volatilizes in a heat treatment step such as a drying step before development, so that the concentration of the polyethylene glycol dissolved in the poly(amic acid) resin decreases and development acceleration cannot be attained.

The polyethylene glycol is incorporated in an amount of generally 5 to 40 parts by weight, preferably 10 to 30 parts by weight, per 100 parts by weight of the poly(amic acid) resin. If the amount of the polyethylene glycol incorporated is smaller than the lower limit, the effect of increasing the rate of development is insufficient. On the other hand, if the amount thereof exceeds the upper limit, there are cases where part of the polyethylene glycol remains undissolved in the poly(amic acid) resin to cause sea-island phase separation and thereby cause blushing or, through imidization, give a film having deteriorated properties.

The photosensitive resin composition of the invention can be easily obtained by, for example, preparing a solution of the poly(amic acid) resin in the manner described above, subsequently adding the 1,4-dihydropyridine derivative and a polyethylene glycol to the solution in the respective proportions shown above, and then stirring the mixture to dissolve the ingredients added.

The photosensitive resin composition of the invention may further contain a polyhydric phenol compound besides the poly(amic acid) resin, 1,4-dihydropyridine derivative and polyethylene glycol. Due to the incorporation of a polyhydric phenol compound, the polyimide resin film obtained through imidization is effectively prevented from coloring. Namely, the polyimide resin film can be obtained as a light-colored film.

The polyhydric phenol compound used preferably has a molecular weight in the range of from 200 to 2,000. Examples of such polyhydric phenol compounds include 2,2'-dihydroxybiphenyl, 4,4'-dihydroxybiphenyl, 4,4'-methylenebisphenol, 1,1-bis(4-hydroxyphenyl)ethane, 2,2-bis(4-hydroxyphenyl)propane, 2,2-bis(4-hydroxyphenyl) hexafluoropropane, phenolic novolac and cresol novolac.

The polyhydric phenol compound is incorporated in an amount of generally 0.5 to 30 parts by weight, preferably 5 to 20 parts by weight, per 100 parts by weight of the poly(amic acid) resin. If the amount of the polyhydric phenol compound incorporated is smaller than the lower limit, the effect of preventing coloration is insufficient. On the other hand, if the amount thereof exceeds the upper limit, there are cases where sea-island phase separation occurs to thereby cause blushing or, through imidization, give a film having deteriorated properties.

This photosensitive resin composition of the invention can also be easily obtained by, for example, preparing a solution of the poly(amic acid) resin in the manner described above, subsequently adding the 1,4-dihydropyridine derivative, a polyethylene glycol and a polyhydric phenol compound to the solution in the respective proportions shown above, and then stirring the mixture to dissolve the ingredients added.

The photosensitive resin composition of the invention thus obtained is applied to a given substrate and dried. The resulting coating film is irradiated with actinic rays through a photomask having a given pattern and then heated (post-exposure heating), whereby a negative latent image can be formed. This film can be rapidly developed even with a developing solution consisting only of an inexpensive aqueous alkali solution, e.g., sodium hydroxide solution. As a result, a satisfactory negative-pattern film can be formed with high sensitivity, high resolution and a reduced film loss.

This negative-pattern film is imidized by heating, whereby a polyimide resin film can be formed which is excellent in heat resistance, electrical properties, mechanical properties and adhesion to the substrate. In the case where the photosensitive resin composition contains a polyhydric phenol compound, the polyimide resin film obtained is a light-colored film. Because of this, the photosensitive resin composition of the invention is suitable for use as a material for forming insulating layers, such as an interlayer dielectric and a surface protective layer, for the insulation or protection of solid elements and circuit boards in the semiconductor industry.

A method for forming an insulating layer in a circuit board from the photosensitive resin composition of the invention will be explained below.

In this method, a given substrate 1 is prepared first as shown in FIG. 1(a). A solution of a photosensitive resin composition 2 is applied to the substrate 1 and the coating is thermally dried by, e.g., hot-air drying to form a film of the photosensitive resin composition 2 (poly(amic acid) resin) as shown in FIG. 1(b).

Examples of the substrate 1 include foils or sheets of metals or alloys such as copper, aluminum, stainless steel, copper-beryllium, phosphor bronze and iron-nickel; foils or plates of ceramics, such as silicon wafers and glasses; and films of plastics such as polyimide resins.

For applying the photosensitive resin composition 2, a known coating technique such as coating with a spin coater or bar coater may be suitably used according to the shape of the substrate 1 or the desired coating thickness. It is preferred to apply the composition in a thickness of 1 to 50 $\mu$m, preferably 10 to 30 $\mu$m, on a dry basis. After the application, drying may be conducted by heating at 50 to 120° C. If the temperature for drying is lower than 50° C. the rate of solvent removal is so low that film formation necessitates much time. If the temperature is higher than 120° C. there are cases where the poly(amic acid) resin begins to imidize.

Subsequently, as shown in FIG. 1(c), the film of the photosensitive resin composition 2 (poly(amic acid) resin) formed by thermal drying is irradiated with actinic rays through a photomask 3. If desired, heating may be conducted thereafter. Thus, a negative latent image is formed. This film is developed to form a negative image, i.e., a film of a given pattern, as shown in FIG. 1(d).

Preferable actinic rays are ultraviolet rays. The wavelength of the exposure light is preferably 300 to 450 nm, more preferably 350 to 420 nm. The integrated exposure amount is preferably 100 to 5,000 mJ/cm$^2$, more preferably 200 to 3,000 mJ/cm$^2$. After the exposure, heating is preferably conducted at about 140° C. or higher (post-exposure heating). The post-exposure heating at about 140° C. or higher is effective in reducing the solubility of the exposed areas in a developing solution comprising an aqueous alkali solution to thereby enable a satisfactory negative image to be formed through the subsequent development.

The film exposed is then developed. This treatment may be conducted by a conventional technique such as immersion method or spraying method. An aqueous solution of an inorganic alkali such as sodium hydroxide or potassium hydroxide can, for example, be used as a developing solution. It is also possible to use, according to need, an aqueous solution of an organic alkali such as propylamine, butylamine, monoethanolamine, tetramethylammonium hydroxide or choline. After the development, the film is rinsed with water to thereby obtain a film of the photosensitive resin composition 2 (poly(amic acid) resin) which has a given pattern.

In the exposure and development, the photosensitive resin composition 2 of the invention can be rapidly developed even with a developing solution consisting only of an aqueous alkali solution because the composition contains a polyethylene glycol. In addition, the composition has excellent sensitivity and resolution, and patterning can be conducted with a reduced film loss.

Thereafter, the film of the photosensitive resin composition 2 (poly(amic acid) resin) of a given pattern is cured to thereby obtain an insulating layer 4 consisting of a polyimide resin, as shown in FIG. 1(e). The curing may be conducted by a conventional technique, for example, heating at around 300 to 500° C. Through the curing, the poly(amic acid) resin is imidized. The insulating layer 4 which is a film of a polyimide resin is thus formed.

Figure 2:
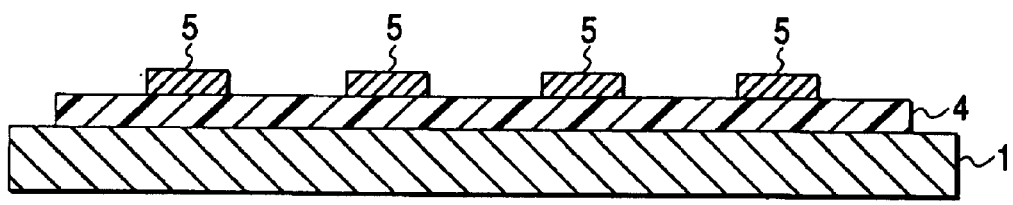
Figure 2:
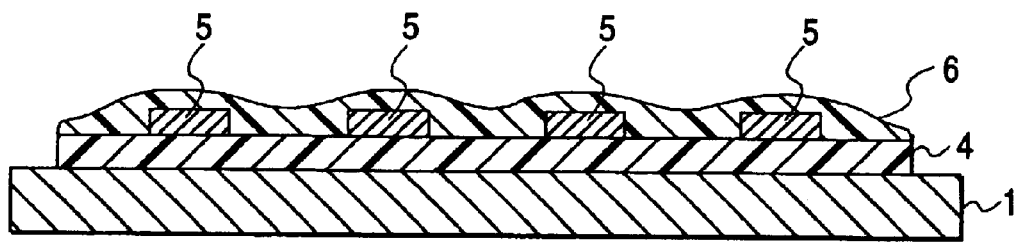

In order for the thus-obtained coated substrate to be used as a circuit board, it may undergo, for example, the following processing. As shown in FIG. 2(a), a conductor layer 5 having a given circuit pattern is formed on the insulating layer 4 serving as a base layer 4 by a conventional patterning technique such as a subtractive, additive or semi additive method. If desired, this conductor layer 5 is coated with a surface protective layer 6 which is an insulating layer, as shown in FIG. 2(b). Thus, a circuit board is obtained. Examples of the conductor for forming the conductor layer 5 include copper, nickel, gold, solder and alloys of these. The thickness of the conductor layer is generally 1 to 15 $\mu$m. A polyimide resin formed from the photosensitive resin composition of the invention may be used as the surface protective layer 6. The thickness of the surface protective layer 6 is generally 2 to 25 $\mu$m. According to applications, etc., conventional resins ordinarily used as other surface protective layers 6 may be used.

The base layer 4 of the circuit board thus obtained is excellent not only in heat resistance, electrical properties and mechanical properties but in adhesion to the substrate 1. Furthermore, in the case where the photosensitive resin composition 2 contains a polyhydric phenol compound, the surface protective layer 6 is obtained as a light-colored film even through heat-curing at 300° C. or higher. In this case, the appearance of the circuit pattern of the conductor layer 5 underlying the surface protective layer 6 can be easily examined, making an inspection easy. Consequently, the circuit board can be effectively used as a highly reliable circuit board.

For example, such a circuit board effectively usable as a highly reliable circuit-bearing suspension substrate can be obtained by forming an insulating layer from the photosensitive resin composition of the invention on a substrate comprising a metal foil, forming a conductor layer having a given circuit pattern, and then forming a surface protective layer from the photosensitive resin composition of the invention.

Furthermore, a circuit board having a conductor layer of a given circuit pattern formed on an insulating layer can be made effectively usable as a highly reliable circuit board for mounting an electronic part thereon, by coating the conductor layer by forming a surface protective layer having given openings from the photosensitive resin composition of the invention and then forming electrodes on the conductor layer exposed in the openings of the surface protective layer.

Figure 3:
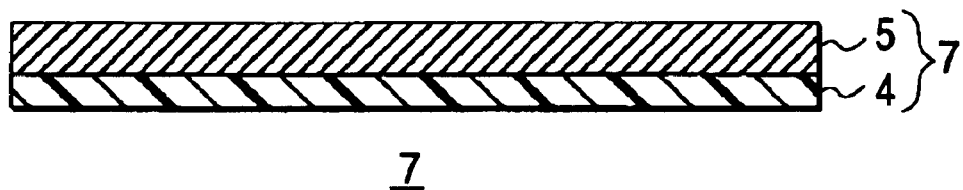
Figure 3:
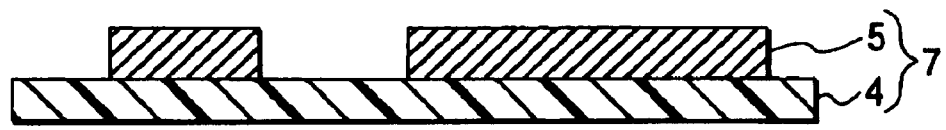
Figure 3:
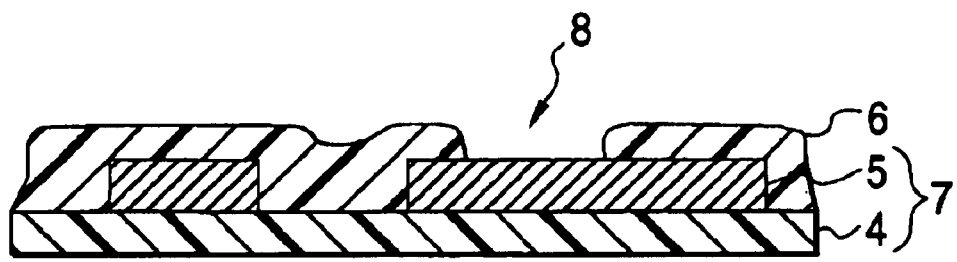

More specifically, such a circuit board may be produced in the following manner. A two-layer substrate 7 is prepared which is comprised of an insulating layer 4 made of, e.g., a polyimide resin and, directly superposed thereon, a conductor layer 5 comprising a copper foil or the like, as shown in FIG. 3(a). The conductor layer 4 of this two-layer substrate 7 is processed so as to have a given circuit pattern by the subtractive or another method as shown in FIG. 3(b). Thereafter, the photosensitive resin composition of the invention is applied to the conductor layer 5 having the given circuit pattern to form a film of the composition. This film is patterned by exposure to actinic rays and development in the same manner as described above. The film patterned is cured to thereby form a surface protective layer 6 comprising a polyimide resin and having a given opening 8, as shown in FIG. 3(c). An electrode is formed by plating, etc., on the conductor layer 5 exposed in the opening 8. Thus, the circuit board for electronic-part mounting is produced.

For producing such a circuit board, a wide variety of known substrates can be used besides the two-layer substrate. For example, a three-layer substrate in which an insulating layer made of a polyimide resin or the like is superposed through an adhesive layer on a conductor layer comprising a copper foil or the like may be used to produce the circuit board.

A more specific example of the circuit board described above is an interposer for semiconductor element mounting which has a surface protective layer formed from the photosensitive resin composition of the invention. This circuit board can be effectively used as a highly reliable interposer for semiconductor element mounting thereon.

The invention will be explained below in more detail by reference to Examples and Comparative Examples. However, the invention should not be construed as being limited to these Examples in any way.

EXAMPLE 1

3,3',4,4'-Biphenyltetracarboxylic dianhydride and p-phenylenediamine were dissolved in an equimolar proportion in N-methyl-2-pyrrolidone in such respective amounts as to result in a total monomer concentration of 16% by weight. This solution was maintained at room temperature for 12 hours and then heated at 75° C. for 24 hours to react the monomers. Thus, a solution of a poly(amic acid) resin was obtained.

To this solution were added 15 parts by weight of I-ethyl-3,5-dimethoxycarbonyl-4-(2-nitrophenyl)-1,4-dihydropyridine and 20 parts by weight of a polyethylene glycol having an average molecular weight of 600, per 100 parts by weight of the poly(amic acid) resin (on a solid basis). The resulting mixture was stirred to uniformly dissolve the ingredients added. Thus, a solution of a photosensitive resin composition was obtained.

This solution of a photosensitive resin composition was applied to an SUS foil with a spin coater and then dried in a 100° C. oven for 20 minutes to form a film. Thereafter, contact exposure was conducted through a glass mask with a 250W extra-high-pressure mercury lamp in an exposure amount of 200 mJ/cm$^2$. After the exposure, the film was heated in a 165° C. oven for 10 minutes and then developed at 55° C. with an aqueous sodium hydroxide solution (developing solution) having a concentration of 1.5% by weight. Upon immersion, the unexposed areas dissolved away in 3 minutes. Subsequently, the film developed was rinsed with water to obtain a satisfactory negative-pattern film consisting only of the exposed areas distinctly remaining on the SUS foil. This film had a thickness of 18 μm.

This patterned film was heated in a nitrogen atmosphere at 330° C. for 1 hour to imidize the poly(amic acid) resin and thereby form a film made of a polyimide resin. After the imidization, the film had a thickness of 14 μm and the retention of film thickness was about 80% based on the thickness as measured before the thermal imidization. The film obtained was black-brown, and the underlying SUS foil was hardly visible.

EXAMPLE 2

To the same poly(amic acid) resin solution as in Example 1 were added 15 parts by weight of 1-ethyl-3,5-dimethoxycarbonyl-4-(2-nitrophenyl)-1,4-dihydropyridine, 20 parts by weight of a polyethylene glycol having an average molecular weight of 600 and 10 parts by weight of 2,2-bis(4-hydroxyphenyl)propane, per 100 parts by weight of the poly(amic acid) resin (on a solid basis). The resulting mixture was stirred to uniformly dissolve the ingredients added. Thus, a solution of a photosensitive resin composition was obtained.

A negative-pattern film of the poly(amic acid) resin was formed on an SUS foil in the same manner as in Example 1. The time required for development was 2 minutes.

Furthermore, imidization was conducted at 330° C. in the same manner as in Example 1 to form a film made of a polyimide resin. After the imidization, the film had a thickness of 16 μm. The film obtained had less colored than the imidized film obtained in Example 1. Through this film, the underlying SUS foil was clearly seen.

EXAMPLE 3

3,3',4,4'-Biphenyltetracarboxylic dianhydride, p-phenylenediamine, and 4,4'-diaminodiphenyl ether were dissolved in a molar ratio of 1/0.85/0.15 in N-methyl-2-pyrrolidone in such respective amounts as to result in a total monomer concentration of 16% by weight. This solution was maintained at room temperature for 12 hours and then heated at 75° C. for 24 hours to react the monomers. Thus, a solution of a poly(amic acid) resin was obtained.

To this solution were added 15 parts by weight of 1-ethyl-3,5-dimethoxycarbonyl-4-(2-nitrophenyl)-1,4-dihydropyridine, 20 parts by weight of a polyethylene glycol having an average molecular weight of 600 and 10 parts by weight of 2,2-bis(4-hydroxyphenyl)propane, per 100 parts by weight of the poly(amic acid) resin (on a solid basis). The resulting mixture was stirred to uniformly dissolve the ingredients added. Thus, a solution of a photosensitive resin composition was obtained.

A negative-pattern film of the poly(amic acid) resin was formed on an SUS foil in the same manner as in Example 1. The time required for development was 2 minutes and 30 seconds. This film had a thickness of 20 μm.

Furthermore, imidization was conducted at 330° C. in the same manner as in Example 1 to form a film made of a polyimide resin. After the imidization, the film had a thickness of 16 μm. The film obtained had less colored than the imidized film obtained in Example 1. Through this film, the underlying SUS foil was clearly seen.

EXAMPLE 4

A solution of a photosensitive resin composition was obtained in the same manner as in Example 3, except that a polyethylene glycol having an average molecular weight of 200 was used in place of the polyethylene glycol having an average molecular weight of 600.

A negative-pattern film of a poly(amic acid) resin was formed on an SUS foil in the same manner as in Example 1.

The time required for development was 10 minutes. Although this development time was longer than in Example 3, it was within a practical range. This film had a thickness of 18 µm.

Furthermore, imidization was conducted at 330° C. in the same manner as in Example 1 to form a film made of a polyimide resin. After the imidization, the film had a thickness of 14 µm. The film obtained had less colored than the imidized film obtained in Example 1. Through this film, the underlying SUS foil was clearly seen.

EXAMPLE 5

A solution of a photosensitive resin composition was obtained in the same manner as in Example 3, except that a polyethylene glycol having an average molecular weight of 400 was used in place of the polyethylene glycol having an average molecular weight of 600.

A negative-pattern film of a poly(amic acid) resin was formed on an SUS foil in the same manner as in Example 1. The time required for development was 3 minutes. This film had a thickness of 18 µm.

Furthermore, imidization was conducted at 330° C. in the same manner as in Example 1 to form a film made of a polyimide resin. After the imidization, the film had a thickness of 15 µm. The film obtained had less colored than the imidized film obtained in Example 1. Through this film, the underlying SUS foil was clearly seen.

EXAMPLE 6

A solution of a photosensitive resin composition was obtained in the same manner as in Example 3, except that a polyethylene glycol having an average molecular weight of 1,000 was used in place of the polyethylene glycol having an average molecular weight of 600.

A negative-pattern film of a poly(amic acid) resin was formed on an SUS foil in the same manner as in Example 1. The time required for development was 3 minutes. This film had a thickness of 20 µm.

Furthermore, imidization was conducted at 330° C. in the same manner as in Example 1 to form a film made of a polyimide resin. After the imidization, the film had a thickness of 16 µm. The film obtained had less colored than the imidized film obtained in Example 1. Through this film, the underlying SUS foil was clearly seen.

EXAMPLE 7

A solution of a photosensitive resin composition was obtained in the same manner as in Example 3, except that a polyethylene glycol having an average molecular weight of 2,000 was used in place of the polyethylene glycol having an average molecular weight of 600.

A negative-pattern film of a poly(amic acid) resin was formed on an SUS foil in the same manner as in Example 1. The time required for development was 15 minutes, and the film had slightly blushed. These results indicate that the upper limit of the average molecular weight of polyethylene glycol in this Example is in about that degree. This film had a thickness of 17 µm.

EXAMPLE 8

A solution of a photosensitive resin composition was obtained in the same manner as in Example 3, except that the amount of the polyethylene glycol having an average molecular weight of 600 was changed to 10 parts by weight.

A negative-pattern film of a poly(amic acid) resin was formed on an SUS foil in the same manner as in Example 1. The time required for development was 5 minutes. This film had a thickness of 20 µm.

Furthermore, imidization was conducted at 330° C. in the same manner as in Example 1 to form a film made of a polyimide resin. After the imidization, the film had a thickness of 17 µm. The film obtained had less colored than the imidized film obtained in Example 1. Through this film, the underlying SUS foil was clearly seen.

EXAMPLE 9

A solution of a photosensitive resin composition was obtained in the same manner as in Example 3, except that a phenolic novolac having an average molecular weight of 350 was used in place of the 2,2-bis(4-hydroxyphenyl) propane.

A negative-pattern film of a poly(amic acid) resin was formed on an SUS foil in the same manner as in Example 1. The time required for development was 2 minutes and 30 seconds. This film had a thickness of 20 µm.

Furthermore, imidization was conducted at 330° C. in the same manner as in Example 1 to form a film made of a polyimide resin. After the imidization, the film had a thickness of 16 µm. The film obtained had less colored than the imidized film obtained in Example 1. Through this film, the underlying SUS foil was clearly seen.

EXAMPLE 10

A solution of a photosensitive resin composition was obtained in the same manner as in Example 3, except that a phenolic novolac having an average molecular weight of 1,000 was used in place of the 2,2-bis(4-hydroxyphenyl) propane.

A negative-pattern film of a poly(amic acid) resin was formed on an SUS foil in the same manner as in Example 1. The time required for development was 4 minutes. This film had a thickness of 20 µm.

Furthermore, imidization was conducted at 330° C. in the same manner as in Example 1 to form a film made of a polyimide resin. After the imidization, the film had a thickness of 16 µm. The film obtained had less colored than the imidized film obtained in Example 1. Through this film, the underlying SUS foil was clearly seen.

EXAMPLE 11

The same photosensitive resin composition as in Example 3 was applied with a spin coater to a stainless steel (SUS304) foil having a thickness of 25 µm. The coating was dried in a 100° C. oven for 20 minutes to form a film having a thickness of 17 µm. Subsequently, the film was irradiated with ultraviolet through a mask in an exposure amount of 200 mJ/cm$^2$. Thereafter, the film was heated at 165° C. for 10 minutes and then developed at 55° C. with an aqueous sodium hydroxide solution (developing solution) having a concentration of 1.5% by weight. Upon immersion, the unexposed areas dissolved away in 2 minutes. Subsequently, the film developed was rinsed with water to obtain a satisfactory negative-pattern film consisting only of the exposed areas distinctly remaining on the stainless-steel foil. This film had a thickness of 17 µm.

This patterned film was heated in a nitrogen atmosphere at 330° C. for 1 hour to imidize the poly(amic acid) resin. Thus, a base layer comprising a polyimide resin and having a thickness of 10 µm was formed.

On this base layer were formed a thin chromium film and a thin copper film by sputtering in thicknesses of 500 Å and 1,000 Å, respectively. Electroplating was conducted thereon using copper sulfate to form a conductor layer comprising a copper deposit having a thickness of 10 μm. Thereafter, the thin copper film and the thin chromium film were removed by etching in an ordinary way to form a given circuit pattern. Electroless plating was then conducted to form a thin nickel film having a thickness of about 0.5 μm on the patterned conductor layer.

Subsequently, the same photosensitive resin composition was applied and dried in the same manner, and the resulting film was subjected to exposure, post-exposure heating, development, and thermal imidization in the same manner to thereby form a surface protective layer in given areas on the patterned conductor layer. Thus, a circuit board was obtained which had a base layer and a surface protective layer each formed from the photosensitive resin composition of the invention. This circuit board corresponds to FIG. 2(b). Since the surface protective layer had colored little, the conductor layer underlying the surface protective layer could be easily seen.

EXAMPLE 12

3,3',4,4'-Biphenyltetracarboxylic dianhydride, p-phenylenediamine and 4,4'-diaminodiphenyl ether were dissolved in a molar ratio of 1/0.85/0.15 in N-methyl-2-pyrrolidone in such respective amounts as to result in a total monomer concentration of 16% by weight. This solution was maintained at room temperature for 12 hours and then heated at 75° C. for 24 hours to react the monomers. Thus, a solution of a poly(amic acid) resin was obtained.

A copper foil having a thickness of 18 μm used as a conductor layer was coated on its matted side with the poly(amic acid) resin solution described above. The resulting coating was dried at 100° C. for 30 minutes to form a film of the poly(amic acid) resin. This film was heated in a nitrogen atmosphere at 330° C. for 1 hour to cure (imidize) it and thereby form an insulating layer comprising a polyimide resin directly on the copper foil. Thus, a two-layer substrate was produced. The insulating layer of this two-layer substrate had a thickness of 12 μm. This two-layer substrate corresponds to FIG. 3(a).

Subsequently, a photoresist comprising a dry film was superposed on the copper foil of the two-layer substrate. This photoresist was exposed to light through a photomask and then developed to thereby form a photoresist pattern corresponding to the pattern to be formed. Using this photoresist as a mask, the copper foil was chemically etched with an aqueous solution of ferric chloride. Thereafter, the photoresist was removed with an aqueous sodium hydroxide solution to thereby form a copper foil of a given circuit pattern (corresponding to FIG. 3(b)).

On the patterned copper foil was formed a thin nickel film having a thickness of 0.5 μm by electroless plating. Thereafter, the same solution of a photosensitive resin composition as in Example 1 was applied thereto to form a surface protective layer comprising a polyimide resin and having given openings in the same manner as in Example 1. Thus, a circuit board was obtained. This circuit board corresponds to FIG. 3(c). These openings serve as connecting terminal parts after electrode formation thereon.

The time required for the development for pattern formation was 3 minutes. The surface protective layer obtained had a thickness of 14 μm. Since the protective layer was black-brown, it was difficult to visually observe the pattern shape of the copper foil.

EXAMPLE 13

A circuit board was obtained in the same manner as in Example 12, except that the same solution of a photosensitive resin composition as in Example 2 was used for forming a surface protective layer.

The time required for the development for pattern formation was 2 minutes. The surface protective layer obtained had a thickness of 16 μm. This surface protective layer had less colored than that obtained in Example 12, so that the pattern shape of the copper foil could be visually observed clearly.

COMPARATIVE EXAMPLE 1

To the same poly(amic acid) resin solution as in Example 1 was added 15 parts by weight of 1-ethyl-3,5-dimethoxycarbonyl-4-(2-nitrophenyl)-1,4-dihydropyridine per 100 parts by weight of the poly(amic acid) resin (on a solid basis). The resulting mixture was stirred to uniformly dissolve the ingredient added. Thus, a solution of a photosensitive resin composition was obtained.

A negative-pattern film of the poly(amic acid) resin was formed on an SUS foil in the same manner as in Example 1. In development, however, the unexposed areas did not completely dissolve away even in 30 minute immersion. This photosensitive resin composition was thus found to be unsuitable for practical use because it necessitated too long a development time.

COMPARATIVE EXAMPLE 2

To the same poly(amic acid) resin solution as in Example 3 was added 15 parts by weight of 1-ethyl-3,5-dimethoxycarbonyl-4-(2-nitrophenyl)-1,4-dihydropyridine per 100 parts by weight of the poly(amic acid) resin (on a solid basis). The resulting mixture was stirred to uniformly dissolve the ingredient added. Thus, a solution of a photosensitive resin composition was obtained.

A negative-pattern film of the poly(amic acid) resin was formed on an SUS foil in the same manner as in Example 1. In development, however, the unexposed areas did not completely dissolve away even in 30 minute immersion. This photosensitive resin composition was thus found to be unsuitable for practical use because it necessitated too long a development time.

The photosensitive resin composition of the invention gives a film which can be rapidly developed even with a developing solution consisting only of an inexpensive aqueous alkali solution, e.g., sodium hydroxide solution. As a result, a satisfactory negative-pattern film can be formed with high sensitivity, high resolution, and a reduced film loss.

Consequently, by thermally imidizing this negative-pattern film, a polyimide resin film can be formed which is excellent in heat resistance, electrical properties, mechanical properties and adhesion to the substrate. In the case where the photosensitive resin composition contains a polyhydric phenol compound, the resin is inhibited from being colored during imidization and a light-colored polyimide resin film can be formed.

Therefor, the photosensitive resin composition of the invention is suitable for use as a material for forming insulating layers, such as an interlayer dielectric and a surface protective layer, for the insulation or protection of solid elements and circuit boards in the semiconductor industry. The circuit board thus obtained is effectively used as a highly reliable circuit board.

What is claimed is:

1. A negative photosensitive resin composition comprising a poly(amic acid) resin, a 1,4-dihydropyridine derivative represented by the following formula (1), and a polyethylene glycol:

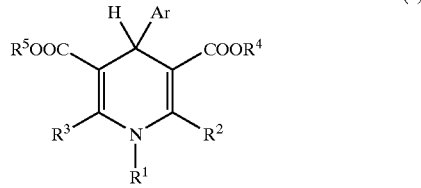
(1)

wherein Ar represents an aromatic group having a nitro group at an ortho position; $R^1$ represents a hydrogen atom or an alkyl group having 1 to 5 carbon atoms; and $R^2$, $R^3$, $R^4$ and $R^5$ each represent a hydrogen atom or an alkyl group having 1 to 4 carbon atoms.

2. The negative photosensitive resin composition as claimed in claim 1, wherein said poly(amic acid) resin has repeating units represented by the following formula (2):

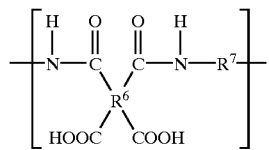
(2)

wherein $R^6$ represents a tetravalent organic group and $R^7$ represents a divalent organic group.

3. The negative photosensitive resin composition as claimed in claim 1, wherein said poly(amic acid) resin has a weight average molecular weight of about 5,000 to 200,000.

4. The negative photosensitive resin composition as claimed in claim 1, wherein said 1,4-dihydropyridine derivative is present in an amount of 5 to 50 parts by weight per 100 parts by weight of the poly(amic acid) resin.

5. The negative photosensitive resin composition as claimed in claim 1, wherein said 1,4-dihydropyridine derivative is selected from the group consisting of 1-ethyl-3,5-dimethoxycarbonyl-4-(2-nitrophenyl)-1,4-dihydropyridine, 1-methyl-3,5-dimethoxycarbonyl-4-(2-nitrophenyl)-1,4-dihydropyridine, 1-propyl-3,5-dimethoxycarbonyl-4-(2-nitrophenyl)-1,4-dihydropyridine and 1-propyl-3,5-diethoxycarbonyl-4-(2-nitrophenyl)-1,4-dihydropyridine.

6. The negative photosensitive resin composition as claimed in claim 1, wherein said polyethylene glycol is present in an amount of 5 to 40 parts by weight per 100 parts by weight of the poly(amic acid) resin.

7. The negative photosensitive resin composition as claimed in claim 1, wherein said polyethylene glycol has a weight average molecular weight of 200 to 2,000.

8. A circuit board having an insulating layer obtained from the negative photosensitive resin composition of claim 1.

9. A circuit board having a surface protective layer obtained from the negative photosensitive resin composition of claim 1.

10. The negative photosensitive resin composition as claimed in claim 1, which further comprises a polyhydric phenol compound.

11. The negative photosensitive resin composition as claimed in claim 10, wherein said polyhydric phenol compound is present in an amount of 0.5 to 30 parts by weight per 100 parts by weight of the poly(amic acid) resin.

12. The negative photosensitive resin composition as claimed in claim 10, wherein said polyhydric phenol compound is selected from the group consisting of 2,2'-dihydroxybiphenyl, 4,4'-dihydroxybiphenyl, 4,4'-methylenebisphenol, 1,1-bis(4-hydroxyphenyl)ethane, 2,2-bis(4-hydroxyphenyl)propane, 2,2-bis(4-hydroxyphenyl) hexafluoropropane, phenolic novolac and cresol novolac.

13. A circuit board having an insulating layer obtained from the negative photosensitive resin composition of claim 10.

14. A circuit board having a surface protective layer obtained from the negative photosensitive resin composition of claim 10.

* * * * *

UNITED STATES PATENT AND TRADEMARK OFFICE
CERTIFICATE OF CORRECTION

PATENT NO. : 6,746,816 B2  
DATED : June 8, 2004  
INVENTOR(S) : Hayashi et al.

It is certified that error appears in the above-identified patent and that said Letters Patent is hereby corrected as shown below:

Title page,
Item [*] Notice, delete the phrase "by 137 days" and insert -- by 236 days --

Signed and Sealed this

Thirtieth Day of November, 2004

JON W. DUDAS
*Director of the United States Patent and Trademark Office*